United States Patent
Kim et al.

(10) Patent No.: US 9,966,285 B2
(45) Date of Patent: May 8, 2018

(54) TEACHING METHOD AND SUBSTRATE TREATING APPARATUS USING THE SAME

(71) Applicant: SEMES CO., LTD., Chungcheongnam-do (KR)

(72) Inventors: Duk Sik Kim, Chungcheongnam-do (KR); Jun Ho You, Chungcheongnam-do (KR)

(73) Assignee: SEMES CO. LTD., Chungcheongnam-Do (KR)

( * ) Notice: Subject to any disclaimer, the term of this patent is extended or adjusted under 35 U.S.C. 154(b) by 51 days.

(21) Appl. No.: 15/161,410

(22) Filed: May 23, 2016

(65) Prior Publication Data

US 2016/0351425 A1  Dec. 1, 2016

(30) Foreign Application Priority Data

May 29, 2015 (KR) .................. 10-2015-0076463

(51) Int. Cl.
*H01L 21/67* (2006.01)
*H01L 21/677* (2006.01)
(Continued)

(52) U.S. Cl.
CPC .... *H01L 21/67259* (2013.01); *H01L 21/6708* (2013.01); *H01L 21/67742* (2013.01);
(Continued)

(58) Field of Classification Search
CPC ............. H01L 21/681; H01L 21/67742; H01L 21/67748; H01L 21/67259;
(Continued)

(56) References Cited

U.S. PATENT DOCUMENTS 4,836,733 A * 6/1989 Hertel ............... H01L 21/67259
198/341.05
4,880,348 A * 11/1989 Baker ..................... H01L 21/68
414/754
(Continued)

FOREIGN PATENT DOCUMENTS

KR 20050115356 A 12/2005
KR 20090047117 A 5/2009
(Continued)

OTHER PUBLICATIONS

Notice of Allowance issued in corresponding Korean application No. 10-2015-0076463 dated May 16, 2017, with English translation, 1 page.

*Primary Examiner* — David S Luo
(74) *Attorney, Agent, or Firm* — Carter, Deluca, Farrell & Schmidt, LLP

(57) ABSTRACT

Disclosed is a teaching method of setting a location of a robot that transports a substrate onto a rotatable support plate that supports the substrate, the teaching method including setting the location of the robot by using decentering values that are acquired by performing an operation of loading the substrate on the support plate with the robot, rotating the support plate by a preset angle, unloading the substrate from the support plate with the robot, and detecting a decentering value of the substrate positioned on a hand of the robot a plurality of times.

24 Claims, 13 Drawing Sheets

(51) Int. Cl.
*H01L 21/68* (2006.01)
*H01L 21/687* (2006.01)

(52) U.S. Cl.
CPC .. *H01L 21/67748* (2013.01); *H01L 21/67766* (2013.01); *H01L 21/67778* (2013.01); *H01L 21/68* (2013.01); *H01L 21/681* (2013.01); *H01L 21/68707* (2013.01)

(58) Field of Classification Search
CPC ......... H01L 21/67265; H01L 21/67161; H01L 21/67196; H01L 21/67745; H01L 21/68792; H01L 21/68; H01L 21/67242; H01L 21/67253; H01L 21/67766; H01L 21/677; H01L 21/6708
USPC ............ 318/568.13, 568.11, 568.1, 567, 560
See application file for complete search history.

(56) References Cited

U.S. PATENT DOCUMENTS

| | | | | |
|---|---|---|---|---|
| 5,264,918 A * | 11/1993 | Kagami | ............ | H01L 21/67259 356/150 |
| 5,789,890 A * | 8/1998 | Genov | ................. | B25J 9/1615 318/567 |
| 6,037,733 A * | 3/2000 | Genov | ................. | B25J 9/1615 318/568.11 |
| 6,121,743 A * | 9/2000 | Genov | .................... | B25J 9/042 318/568.11 |
| 6,405,101 B1 * | 6/2002 | Johanson | .............. | H01L 21/681 356/73 |
| 6,752,585 B2 * | 6/2004 | Reimer | ................ | H01L 21/681 414/783 |
| 6,760,976 B1 * | 7/2004 | Martinson | ......... | H01L 21/67265 33/520 |
| 7,479,236 B2 * | 1/2009 | Chen | ................ | G05B 19/41875 216/58 |
| 7,486,878 B2 * | 2/2009 | Chen | ................ | H01L 21/67259 396/155 |
| 7,720,631 B2 * | 5/2010 | Pike | ................. | H01L 21/67242 702/152 |
| 7,792,350 B2 * | 9/2010 | Kiley | .................... | B65G 25/02 382/141 |
| 7,859,685 B2 * | 12/2010 | Fogel | .................... | B65G 25/02 356/237.1 |
| 7,894,657 B2 * | 2/2011 | van der Meulen | .... | B65G 25/02 382/141 |
| 7,925,378 B2 * | 4/2011 | Gilchrist | ........... | H01L 21/67265 414/222.02 |
| 7,933,665 B2 * | 4/2011 | Sakiya | .................. | B25J 9/1692 700/121 |
| 7,996,178 B2 * | 8/2011 | Pike | .................. | H01L 21/67242 702/152 |
| 8,125,652 B2 * | 2/2012 | Fogel | .................... | B65G 25/02 250/234 |
| 8,135,485 B2 * | 3/2012 | Chen | ....................... | H01L 21/68 216/37 |
| 8,253,948 B2 * | 8/2012 | Kiley | .................... | B65G 25/02 250/234 |
| 8,270,702 B2 * | 9/2012 | Kiley | .................... | B65G 25/02 382/141 |
| 8,634,633 B2 * | 1/2014 | Kiley | .................... | H01L 21/681 382/141 |
| 8,934,706 B2 * | 1/2015 | Kiley | ................... | H01L 21/681 382/141 |
| 2003/0231950 A1 * | 12/2003 | Raaijmakers | ......... | H01L 21/681 414/800 |
| 2006/0100740 A1 * | 5/2006 | Sakiya | .................. | B25J 9/1692 700/246 |
| 2006/0190916 A1 * | 8/2006 | Pike | ................. | H01L 21/67242 716/55 |
| 2007/0071581 A1 * | 3/2007 | Gilchrist | ........... | H01L 21/67265 414/217 |
| 2007/0285673 A1 * | 12/2007 | Kiley | .................... | B65G 25/02 356/614 |
| 2008/0080845 A1 * | 4/2008 | Chen | ................. | H01L 21/67259 396/4 |
| 2008/0081383 A1 * | 4/2008 | Chen | ................ | G05B 19/41875 438/14 |
| 2008/0147333 A1 * | 6/2008 | van der Meulen | .... | B65G 25/02 702/33 |
| 2009/0088887 A1 * | 4/2009 | Chen | ...................... | H01L 21/681 700/114 |
| 2010/0228374 A1 * | 9/2010 | Pike | ................. | H01L 21/67242 700/109 |
| 2011/0093237 A1 * | 4/2011 | Kiley | .................... | B65G 25/02 702/150 |
| 2012/0154822 A1 * | 6/2012 | Kiley | .................... | B65G 25/02 356/614 |
| 2013/0085595 A1 * | 4/2013 | Kiley | .................... | H01L 21/681 700/121 |
| 2014/0207284 A1 * | 7/2014 | Kiley | .................... | H01L 21/681 700/258 |
| 2015/0253765 A1 * | 9/2015 | Katsuda | ................. | B25J 9/163 700/121 |
| 2016/0133502 A1 * | 5/2016 | Won | .................. | H01L 21/68707 700/253 |

FOREIGN PATENT DOCUMENTS

| | | |
|---|---|---|
| KR | 101015778 B1 | 2/2011 |
| KR | 101048818 B1 | 7/2011 |
| KR | 2012-0139057 A | 12/2012 |
| KR | 20130058413 A | 6/2013 |
| KR | 101329327 B1 | 11/2013 |
| KR | 101478401 B1 | 1/2015 |

\* cited by examiner

TEACHING METHOD AND SUBSTRATE TREATING APPARATUS USING THE SAME

CROSS-REFERENCE TO RELATED APPLICATIONS

A claim for priority under 35 U.S.C. § 119 is made to Korean Patent Application No. 10-2015-0076463 filed May 29, 2015, in the Korean Intellectual Property Office, the entire contents of which are hereby incorporated by reference.

BACKGROUND

The inventive concept relates to a teaching method and a substrate treating apparatus using the same, and more particularly, to an automatic teaching method of a substrate feeding robot and a substrate treating apparatus using the same.

A process of manufacturing a semiconductor device and a flat panel display panel includes various processes including a photographing process, an etching process, an ashing process, a thin film deposition process, and a cleaning process. Among the processes, in the photographing process, application, exposure, and development steps are sequentially performed. The application process is a process of applying a photosensitive liquid such as a resist onto a surface of a substrate. The exposure process is a process of exposing a circuit pattern on a substrate in which a photosensitive film is formed. The development process is a process of selectively developing an exposed area of a substrate. The application process largely includes a liquid applying process and an edge bead removal (EBR) process. Here, the liquid applying process is a process of forming a photosensitive film in the entire area of the upper surface of a substrate, and the edge removal (EBR) process is a process of removing a photosensitive film (edge bead) formed in a peripheral area of the substrate.

The substrate feeding apparatus feeds the substrate to a treatment chamber (or a process chamber) that treats various processes. Accordingly, it is necessary for the substrate feeding apparatus to set a location of the feeding robot to precisely supply the substrate to the treatment units. For example, a semiconductor manufacturing facility such as a spinner system or a scrubber has a plurality of treatment units, and a feeding robot feeds the substrate to the treatment units. The treatment units perform the processes, and the substrate is fed to the outside by the feeding robot again. Then, it is very important to precisely position the substrate at a preset location of the plates in the treatment units. If the substrate is inaccurately positioned on a plate of a bake module or an application module, a process error is generated. For example, the entire area of the substrate cannot be uniformly heated or a photoresist cannot be uniformly applied to the substrate. In particular, in recent years, as circuit patterns have become finer, it has become very important to guarantee the precision of an edge bead removal (EBR) process of removing an edge bead at a periphery of a substrate. To achieve this, the importance of a teaching operation of adjusting a location of the feeding robot such that the substrate may be loaded to a precise location has been increasing.

SUMMARY

The inventive concept provides a teaching method of a robot for precisely locating a substrate at a preset location of a support plate, and a substrate treating apparatus.

The inventive concept also provides a substrate treating apparatus that improves the precision of a treatment process.

The aspect of the inventive concept is not limited thereto, and other unmentioned aspects of the inventive concept may be clearly appreciated by those skilled in the art from the following descriptions.

The inventive concept provides a touch method.

In accordance with an aspect of the inventive concept, there is provided a teaching method of setting a location of a robot that transports a substrate onto a rotatable support plate that supports the substrate, the teaching method including setting the location of the robot by using decentering values that are acquired by performing an operation of loading the substrate on the support plate with the robot, rotating the support plate by a preset angle, unloading the substrate from the support plate with the robot, and detecting a decentering value of the substrate positioned on a hand of the robot a plurality of times.

According to an embodiment, the teaching method may further include acquiring a decentering value of the substrate on the hand before the substrate is loaded on the support plate with the robot.

According to an embodiment, the decentering values may be detected by using a sensor provided in the robot.

According to an embodiment, the decentering values may be detected by using a camera.

According to an embodiment, the location of the robot may be set by using acquired three decentering values.

According to an embodiment, the teaching method may further include obtaining a central point of a circle that pass through all the three decentering values, and the location of the robot may be set such that the central point corresponds to the center of the support plate.

According to an embodiment, the preset angle may be 90 degrees and the plurality of times is three times.

According to an embodiment, the teaching method may further include detecting four decentering values, and connecting two sets of two decentering values of the four acquired decentering values to each other, respectively, and the connected lines cross each other to form a cross point, and wherein the location of the robot may be set such that the cross point corresponds to the center of the support plate.

According to an embodiment, two sets of two decentering values of the four acquired decentering values may be connected to each other, respectively, the connected lines may cross each other to form a cross point, and the location of the robot may be set such that the cross point corresponds to the center of the support plate.

In accordance with another aspect of the inventive concept, there is provided a teaching method of setting a location of a robot that transports a substrate onto a rotatable support plate that support the substrate, the teaching method including detecting a primary decentering value of the substrate while the substrate is situated on a hand of the robot, locating the substrate on the support plate and rotating the support plate by 90 degrees, detecting a secondary decentering value of the substrate while the substrate is unloaded from the support plate and situated on the hand of the robot, locating the substrate on the support plate and rotating the support plate by 90 degrees, detecting a tertiary decentering value of the substrate while the substrate is unloaded from the support plate and situated on the hand of the robot, locating the substrate on the support plate and rotating the support plate by 90 degrees, and detecting a quartic decentering value of the substrate while the substrate is unloaded from the support plate and situated on the hand of the robot.

According to an embodiment, a cross point of a first line that connects the primary decentering value and the tertiary decentering value and a second line that connects the secondary decentering value and the quartic decentering value may be obtained, and the location of the robot may be set such that the cross point corresponds to the center of the support plate.

According to an embodiment, the primary detection step may be performed on the hand before the substrate is loaded on the support plate.

According to an embodiment, the primary detection step may be performed on the hand after the substrate is loaded on the support plate and then unloaded from the support plate to the hand.

According to an embodiment, the centering values may be detected by using a sensor provided in the robot.

According to an embodiment, the centering values may be detected by using a camera.

The inventive concept provides a substrate treating apparatus.

In accordance with another aspect of the inventive concept, there is provided an apparatus for treating a substrate, the apparatus including a rotatable support plate that supports the substrate, a robot that has a hand on which the substrate is seated and transports the substrate on the support plate, a detector that detects a decentering value of the substrate, and a controller that has a calculation unit that sets a location of the robot by using detected decentering values, and that controls rotation of the support plate and the robot, wherein the controller sets the location of the robot by using decentering values that are acquired by repeating an operation of loading the substrate on the support plate with the robot, rotating the support plate by a preset angle, unloading the substrate from the support plate with the robot, and detecting a decentering value of the substrate positioned on a hand of the robot a plurality of times.

According to an embodiment, the detector may be a sensor provided in the robot.

According to an embodiment, the detector may be a camera.

According to an embodiment, the controller may control the support and the robot such that the detector acquires three decentering values.

According to an embodiment, the controller may control rotation of the support plate and the robot such that the detector acquires four decentering values while taking the preset angle as 90 degrees.

According to an embodiment, the calculation unit may obtain the center of a circle that passes all the three detected decentering values, and the controller may set the location of the robot such that the center of the support corresponds to the center of the circle.

According to an embodiment, the controller may control rotation of the support plate and the robot such that the detector acquires four decentering values, and the calculation unit connects two pairs of two decentering values of the acquired four decentering values, respectively, cross the connection lines to form a cross point, and sets the location of the robot such that the cross point corresponds to the center of the support plate.

According to an embodiment, the calculation unit may connect two sets of two decentering values of the four acquired decentering values to each other, respectively, may cross the connected lines to form a cross point, and may set the location of the robot such that the cross point corresponds to the center of the support plate.

According to an embodiment, the apparatus may further include an edge bead removal (EBR) nozzle that supplies an edge bead removal liquid to a peripheral area of the substrate such that an edge bead formed at a periphery of the substrate is removed.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

The facility of the present embodiment of the inventive concept may be used to perform a photography process on a substrate such as a semiconductor substrate or a flat display panel. In particular, the facility of the present embodiment may be connected to an exposure apparatus to perform an application process and a development process on a substrate. Hereinafter, a case of using a substrate as a substrate may be described as an example.

Hereinafter, a substrate treating facility and a substrate treating apparatus according to the inventive concept will be described with reference to FIGS. 1 to 5.

Figure 1:
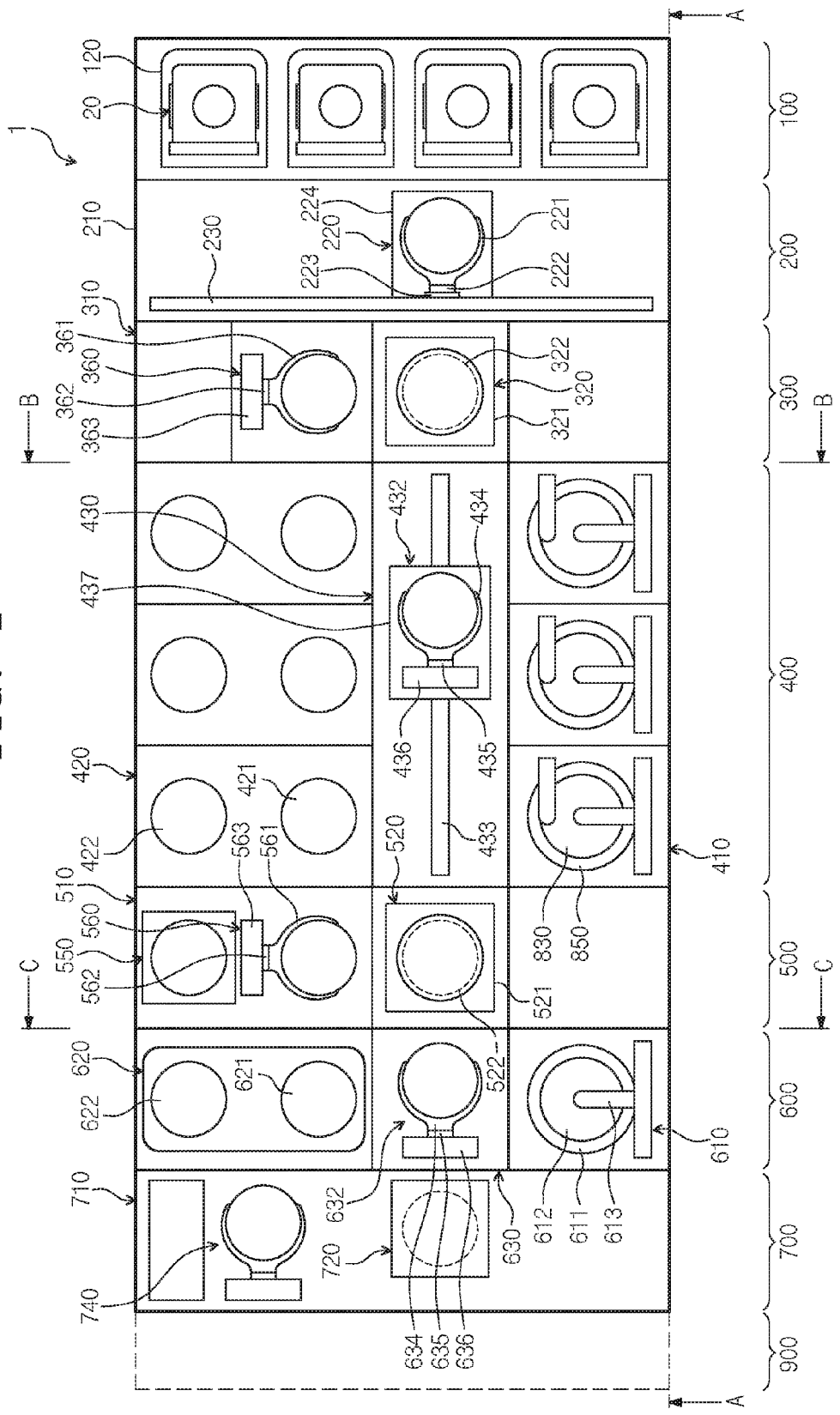
FIG. 1 is a sectional view illustrating a substrate treating facility.
Figure 2:
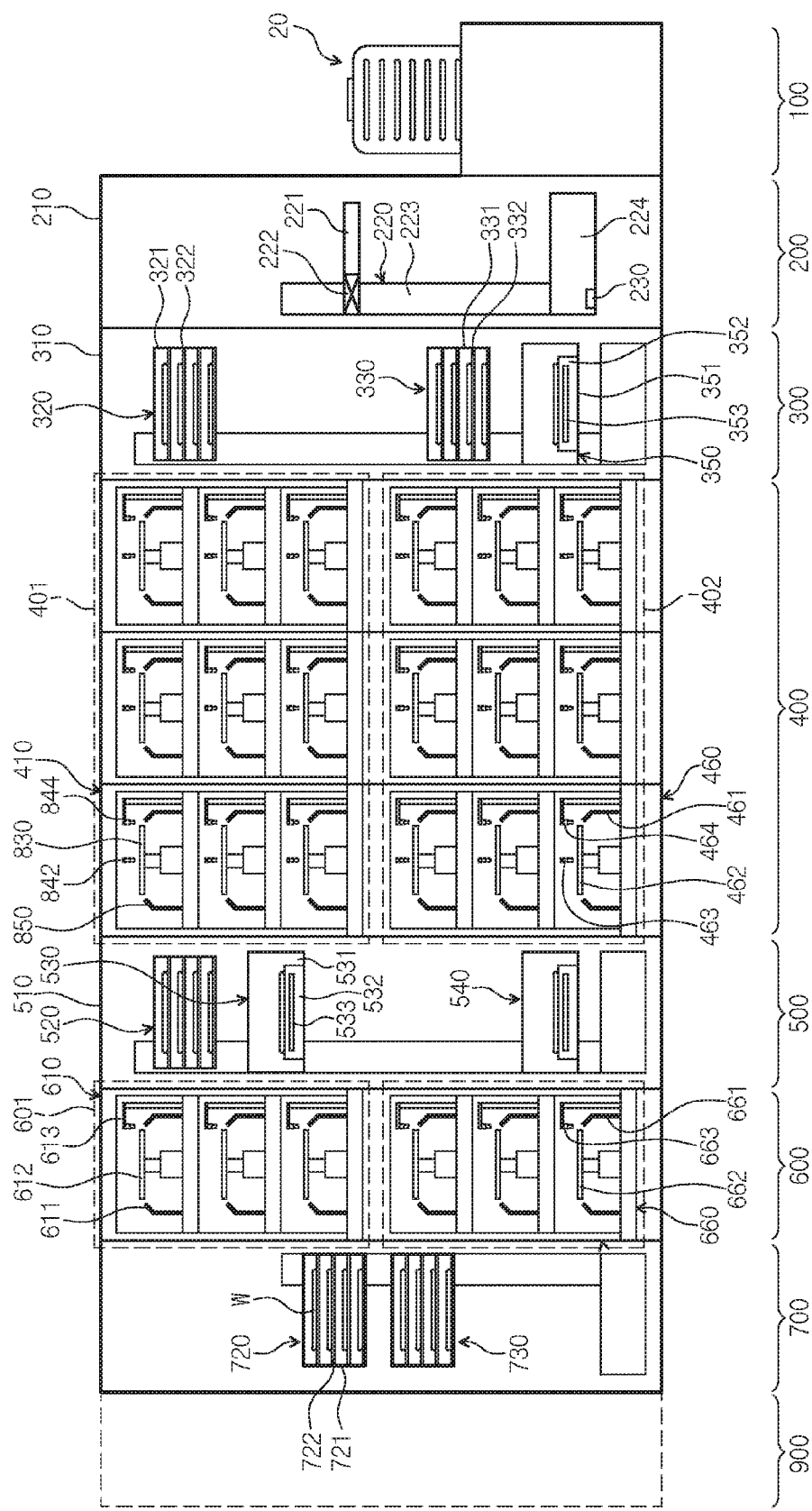
FIG. 2 is a sectional view of the facility of FIG. 1, taken along line A-A of FIG. 1.
Figure 3:
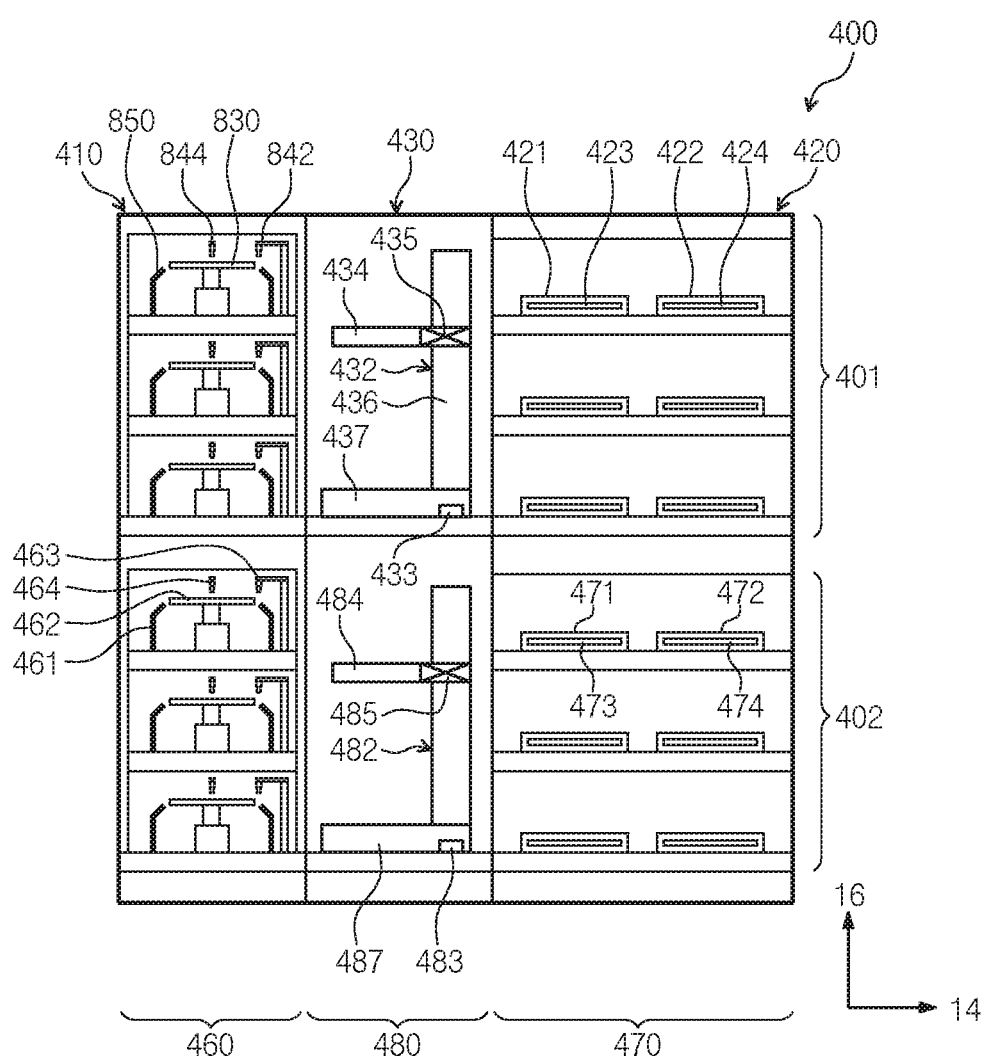
FIG. 3 is a sectional view of the facility of FIG. 1, taken along line B-B of FIG. 1.
Figure 4:
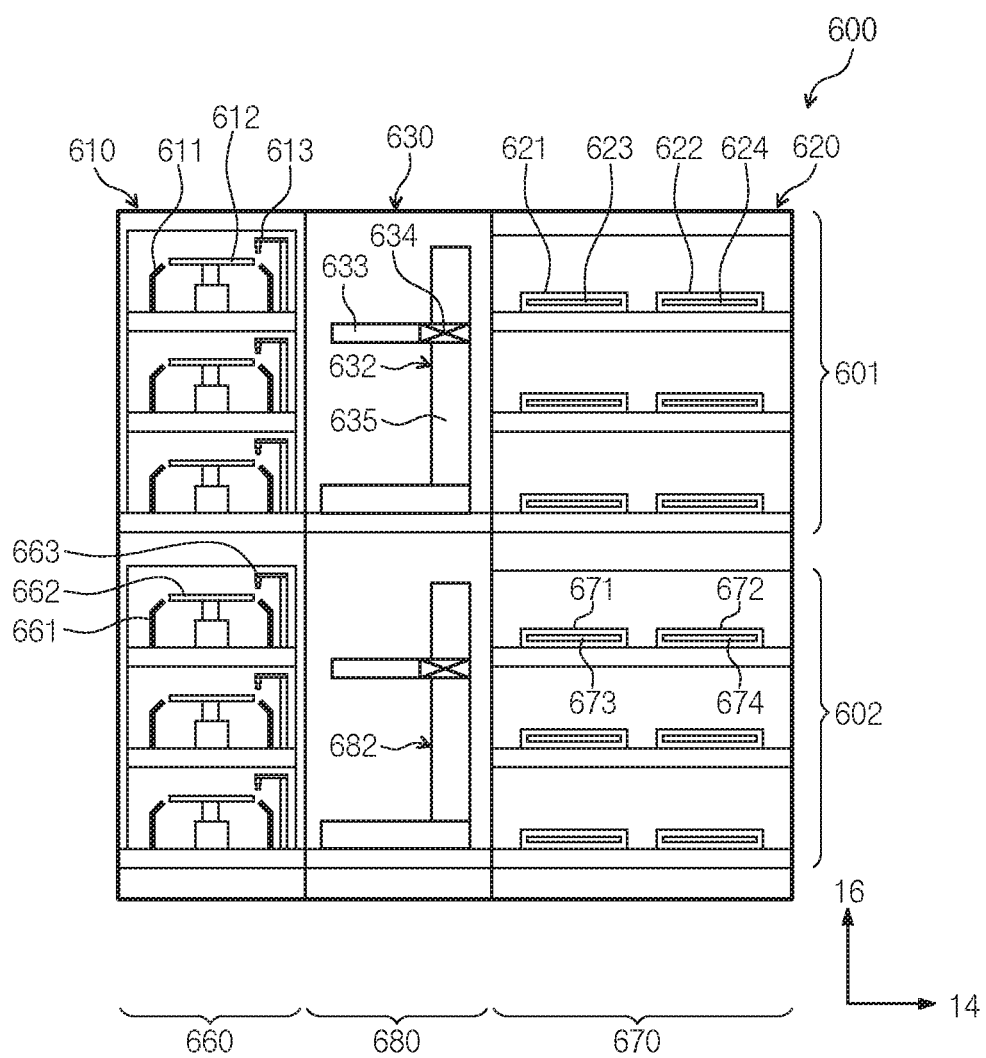
FIG. 4 is a sectional view of the facility of FIG. 1, taken along line C-C of FIG. 1.
Figure 5:
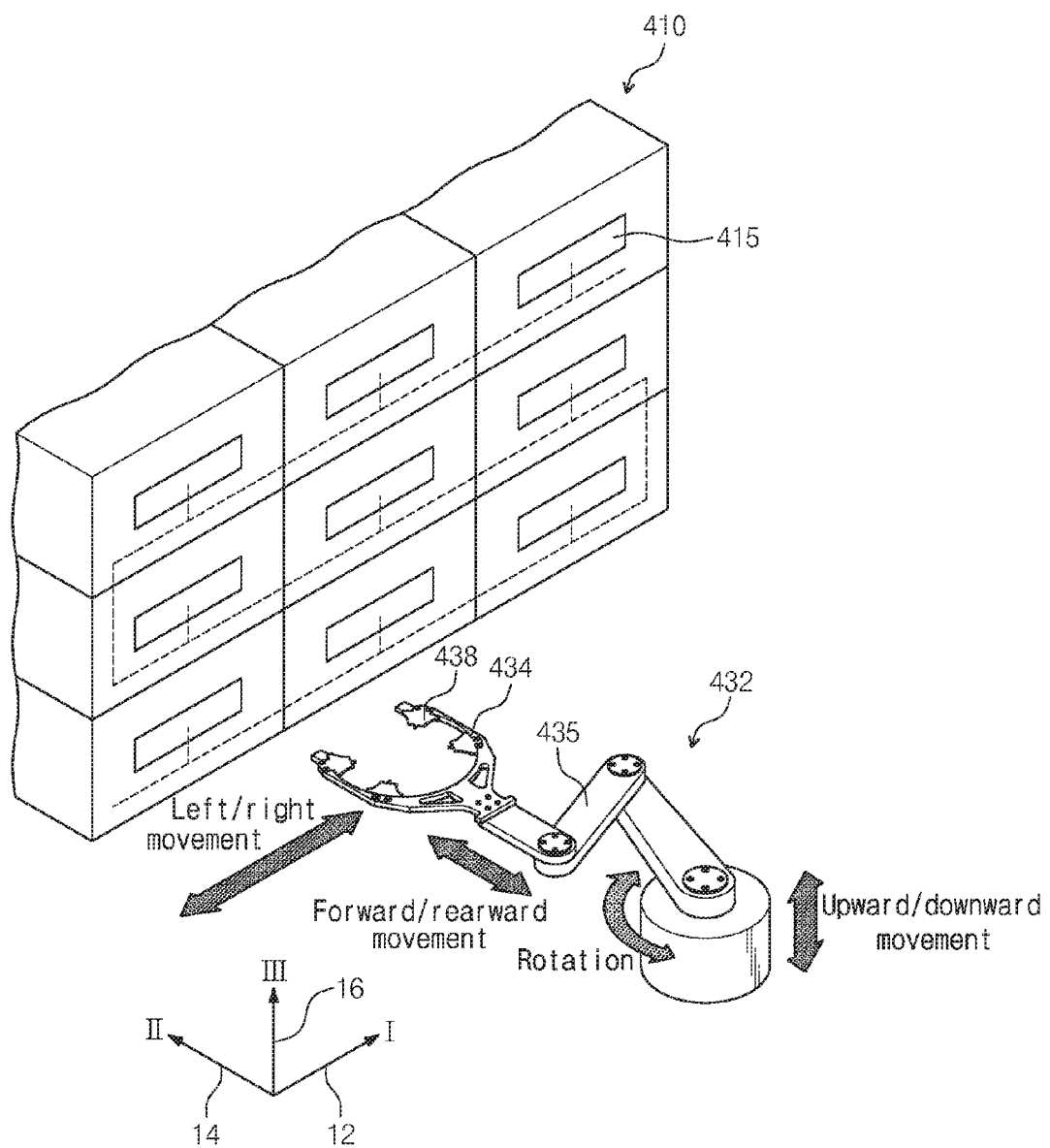
FIG. 5 is a view illustrating a feeding robot of FIG. 1.
Figure 6:
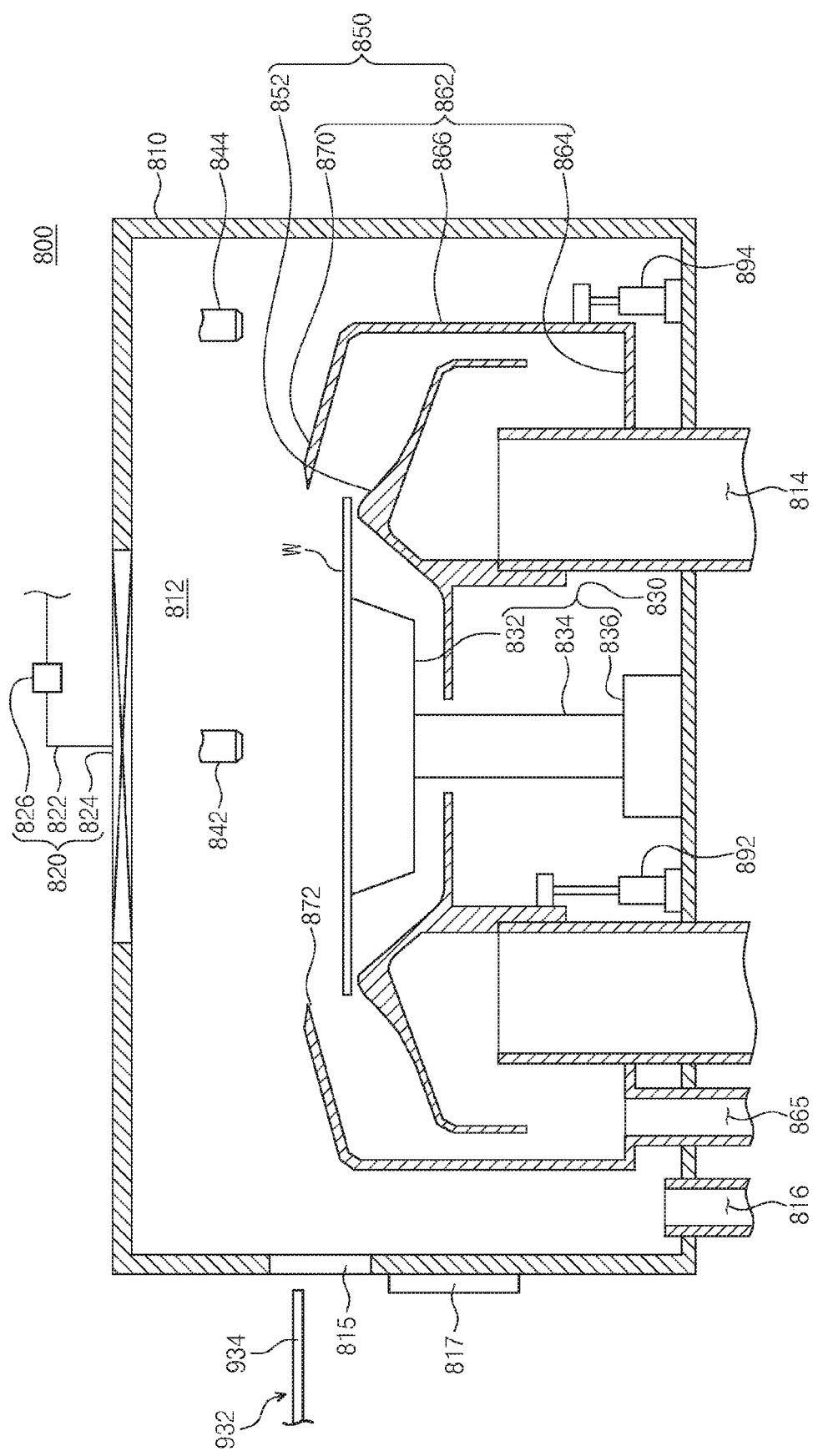
FIG. 6 is a view illustrating a substrate treating apparatus of FIG. 1 according to the inventive concept.
Figure 7:
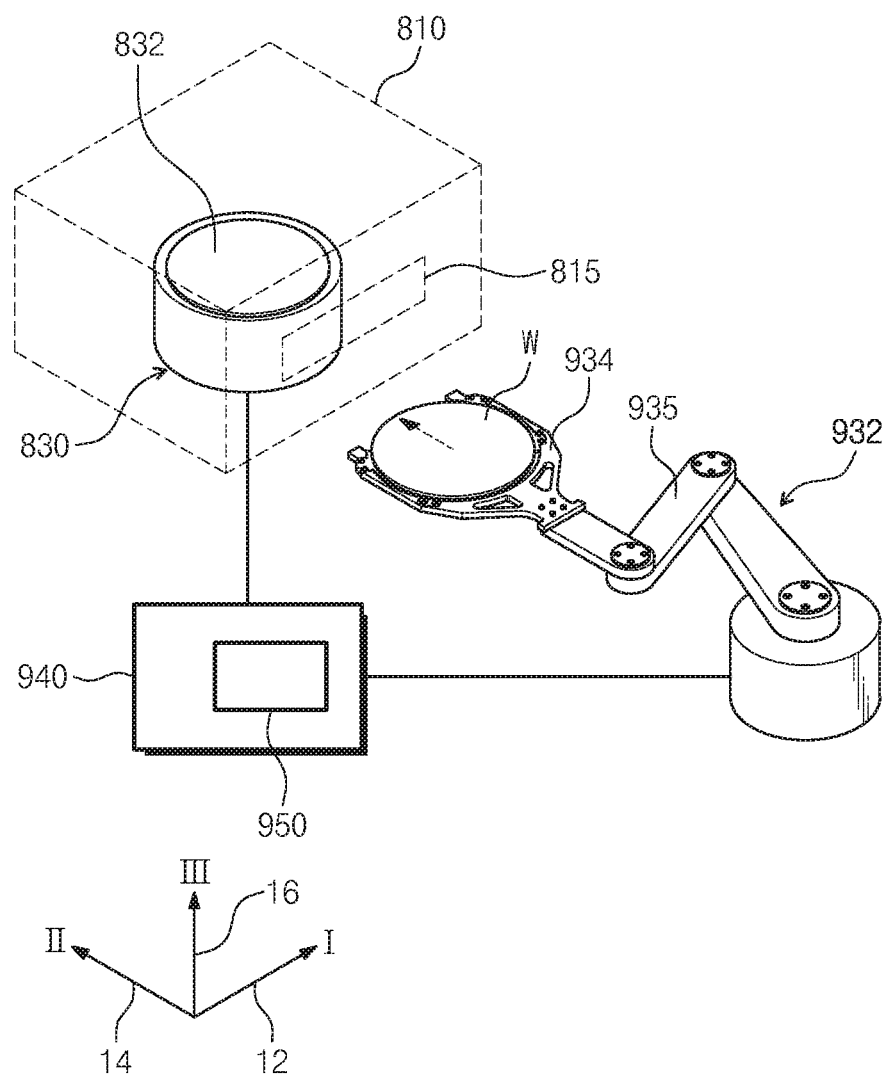
FIGS. 7 to 10 are views illustrating a process of locating a substrate on a support plate by a robot.
Figure 8:
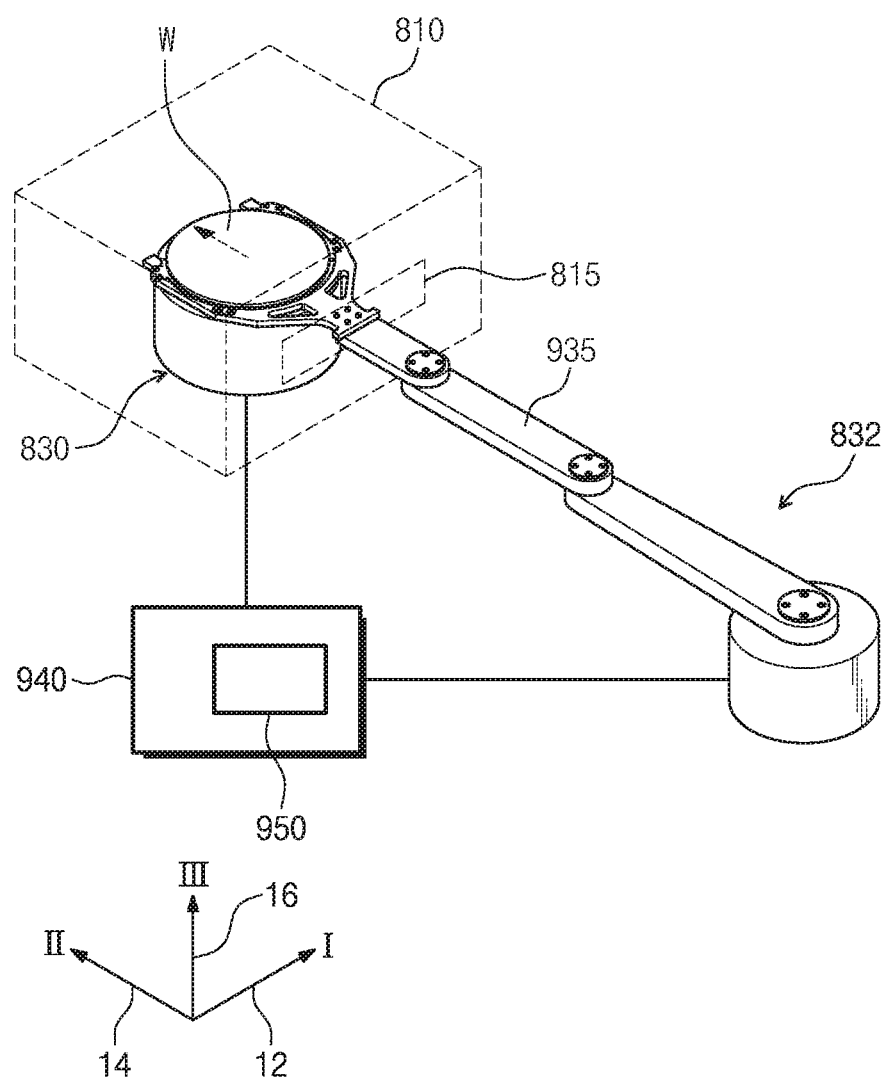
Figure 9:
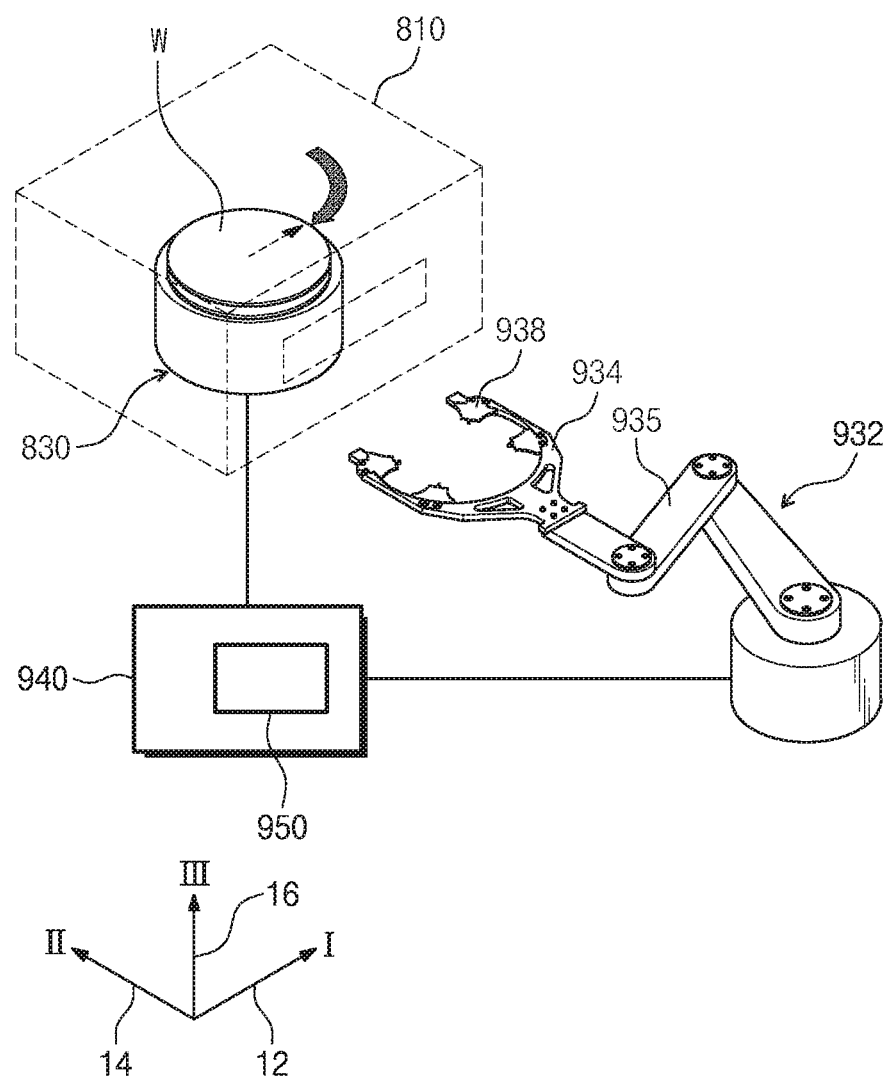
Figure 10:
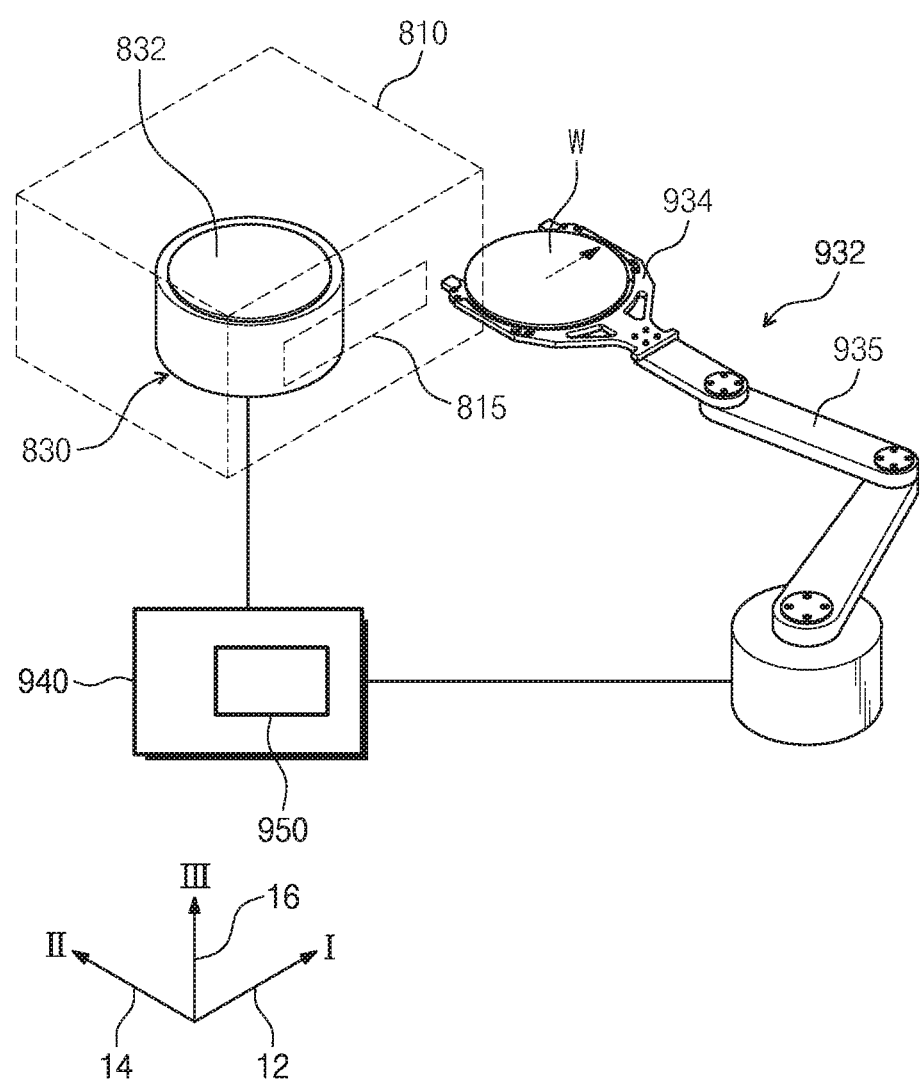

FIG. 1 is a view of the substrate treating facility, viewed from the top. FIG. 2 is a sectional view of the facility of FIG. 1, taken along line A-A of FIG. 1. FIG. 3 is a sectional view of the facility of FIG. 1, taken along line B-B of FIG. 1. FIG. 4 is a sectional view of the facility of FIG. 1, taken along line C-C of FIG. 1.

Referring to FIGS. 1 to 4, the substrate treating facility 1 includes a load port 100, an index module 200, a first buffer module 300, an application/development module 400, a second buffer module 500, a pre/post-exposure treating module 600, and an interface module 700. The load port 100, the index module 200, the first buffer module 300, the application/development module 400, the second buffer module 500, the pre/post-exposure treating module 600, and the interface module 700 are sequentially disposed in a row in one direction.

Hereinafter, a direction in which the load port 100, the index module 200, the first buffer module 300, the application/development module 400, the second buffer module 500, the pre/post-exposure treating module 600, and the interface module 700 are disposed will be referred to as a first direction 12, and a direction that is perpendicular to the first direction 12 when viewed from the top will be referred to as a second direction 14, and a direction that is perpendicular to the first direction 12 and the second direction 14 will be referred to as a third direction 16.

A substrate W is moved while being received in a cassette 20. Then, the cassette 20 has a structure that is sealed from the outside. For example, a front open unified pod (FOUP) that has a door on the front side may be used as the cassette 20.

Hereinafter, the load port 100, the index module 200, the first buffer module 300, the application/development module 400, the second buffer module 500, the pre/post-exposure treating module 600, and the interface module 700 will be described in detail.

The load port 100 has a carrier 120 on which the cassette 20, in which the substrates W are received, is positioned. A plurality of carriers 120 are provided, and are disposed along the second direction 14 in a row. In FIG. 2, four carriers 120 are provided.

The index module 200 feeds a substrate W between the cassette 20 positioned on the carrier 120 of the load port 100 and the first buffer module 300. The index module 200 has a frame 210, an index robot 220, and a guide rail 230. The frame 210 has a substantially rectangular parallelepiped shape having an empty interior, and is disposed between the load part 100 and the first buffer module 300. The frame 210 of the index module 200 may have a height smaller than that of a frame 310 of the first buffer module 300, which will be described below. The index robot 220 and the guide rail 230 are disposed in the frame 210. The index robot 220 has a four-axis driven structure such that a hand 221 that directly handles a substrate W is movable and rotatable in the first direction 12, the second direction 14, and the third direction 16. The index robot 220 has a hand 221, an arm 222, a support 223, and a prop 224. The hand 221 is fixedly installed in the arm 222. The arm 222 has a flexible and rotatable structure. The support 223 is configured such that the lengthwise direction thereof is disposed along the third direction 16. The arm 222 is coupled to the support 223 to be movable along the support 223. The support 223 is fixedly coupled to the prop 224. The guide rail 230 is provided such that the lengthwise direction thereof is disposed along the second direction 14. The prop 224 is coupled to the guide rail 230 to be linearly movable along the guide rail 230. Although not illustrated, the frame 210 is further provided with a door opener that opens and closes a door of the cassette 20.

The first buffer module 300 has a frame 310, a first buffer 320, a second buffer 330, a cooling chamber 350, and a first buffer robot 360. The frame 310 has a rectangular parallelepiped shape having an empty interior, and is disposed between the index module 200 and the application/development module 400. The first buffer 320, the second buffer 330, the cooling chamber 350, and the first buffer robot 360 are situated within the frame 310. The cooling chamber 350, the second buffer 330, and the first buffer 320 are disposed along the third direction 16 sequentially from the bottom. The first buffer 320 is situated at a height corresponding to an application module 401 of the application/development module 400, which will be described below, and the second buffer 330 and the cooling chamber 350 are situated at a height corresponding to a development module 402 of the application/development module 400, which will be described below. The first buffer robot 360 is spaced apart by a predetermined distance in the second direction 14 from the second buffer 330, the cooling chamber 350, and the first buffer 320.

The first buffer 320 and the second buffer 330 temporarily preserve a plurality of substrates W. The second buffer 330 has a housing 331 and a plurality of supports 332. The supports 332 are disposed within the housing 331, and are spaced apart from one another along the third direction 16. One substrate W is positioned on each of the supports 332. The housing 331 has openings (not illustrated) on a side on which the index robot 220 is provided, on a side on which the first buffer robot 360 is provided, and on a side on which a development robot 482 is provided so that the index robot 220, the first buffer robot 360, and a development robot 482 of the development module 402, which will be described below, carries a substrate W into or out of the support 332 in the housing 331. The first buffer 320 has a structure that is substantially similar to that of the second buffer 330. Meanwhile, the housing 321 of the first buffer 320 has an opening on a side on which the first buffer robot 360 is provided and on a side on which an application robot 432 situated in the application module 401, which will be described below, is provided. The number of supports 322 provided for the first buffer 320 and the number of supports 332 provided for the second buffer 330 may be the same or different. According to an embodiment, the number of the supports 332 provided for the second buffer 330 may be larger than the number of the supports 322 provided for the first buffer 320.

The first buffer robot 360 feeds a substrate W between the first buffer 320 and the second buffer 330. The first buffer robot 360 has a hand 361, an arm 362, and a support 363. The hand 361 is fixedly installed in the arm 362. The arm 362 has a flexible structure, and allows the hand 361 to be moved along the second direction 14. The arm 362 is coupled to the support 363 to be linearly movable in the third direction 16 along the support 363. The support 363 has a length extending from a location corresponding to the second buffer 330 to a location corresponding to the first buffer 320. The support 363 may be provided to extend longer upwards or downwards. The first buffer robot 360 may be provided such that the hand 361 is simply two-axis driven along the second direction 14 and the third direction 16.

The cooling chamber 350 cools a substrate W. The cooling chamber 350 has a housing 351 and a cooling plate 352. The cooling plate 352 has a cooling unit 353 that cools an upper surface thereof on which a substrate W is positioned and the substrate W. Various types such as a cooling type using cooling water and a cooling type using a thermoelectric element may be used as the cooling unit 353. A lift pin assembly (not illustrated) that locates a substrate W on the cooling plate 352 may be provided in the cooling chamber 350. The housing 351 has openings (not illustrated) on a side on which the index robot 220 is provided and on a side on which the development robot 482 is provided so that the index robot 220 and the development robot 482 provided for the development robot 402, which will be described below, carry a substrate W into or out of the cooling plate 352. Doors (not illustrated) that open and close the aforementioned openings may be provided in the cooling chamber 350.

The application/development module 400 performs a process of applying a photoresist onto a substrate W before an exposure process and a process of developing the substrate W after the exposure process. The application/development module 400 has a substantially rectangular parallelepiped shape. The application/development module 400 has an application module 401 and a development module 402. The application module 401 and the development module 402 may be disposed to be partitioned from each other in different layers. According to an example, the application module 401 is situated on the development module 402.

The application module 401 performs a process of applying a photosensitive liquid such as a photoresist onto a substrate W and a heat treating process of, for example, heating and cooling the substrate W before and after the resist applying process. The application module 401 has a resist applying chamber 410, a bake chamber 420, and a carrying chamber 430. The resist applying chamber 410, the bake chamber 420, and the carrying chamber 430 are sequentially disposed along the second direction 14. Accordingly, the resist applying chamber 410 and the bake chamber 420 are spaced apart from each other in the second direction 14 while the carrying chamber 430 is interposed therebetween. A plurality of resist applying chambers 410 may be provided, and a plurality of resist applying chambers 410 may be provided in each of the first direction 12 and the third direction 16. In the drawings, six resist applying chambers 410 are illustrated as an example. A plurality of bake chamber 420 may be provided in each of the first direction 12 and the third direction 16. In the drawings, six bake chambers 420 are illustrated as an example. However, unlike this, a larger number of bake chambers 420 may be provided.

The carrying chamber 430 is situated in parallel to the first buffer 320 of the first buffer module 300 in the first direction 12. An application robot 432 and a guide rail 433 may be situated in the carrying chamber 430. The carrying chamber 430 has a substantially rectangular shape. The application robot 432 feeds a substrate W between the bake chambers 420, the resist applying chambers 400, the first buffer 320 of the first buffer module 300, and the first cooling chamber 520 of the second buffer module 500. The guide rail 433 is disposed such that the lengthwise direction thereof is parallel to the first direction 12. The guide rail 433 guides the application robot 432 such that the application robot 432 is linearly moved in the first direction 12.

Hereafter, the application robot 432 will be described with reference to FIGS. 1 to 5.

The application robot 432 is fed into the resist applying chamber 410 through an opening 415. The application robot 432 has a hand 434, an arm 435, a support 436, and a prop 437. The hand 434 is fixedly installed in the arm 435. A substrate is seated on the hand 434. The arm 435 has a flexible structure such that the hand 434 is movable horizontally. The support 436 is provided such that the lengthwise direction thereof is disposed along the third direction 16. The arm 435 is coupled to the support 436 to be linearly movable in the third direction 16 along the support 436. The support 436 is fixedly coupled to the prop 437, and the prop 437 is coupled to the guide rail 433 to be movable along the guide rail 433.

Meanwhile, as will be described below, the application robot 432 may be provided to a robot 932 of the substrate treating apparatus 800 according to an embodiment of the inventive concept.

The resist applying chamber 410 applies a photoresist onto the substrate W. The resist applying chambers 410 have the same structure. However, the types of photoresists used in the resist applying chambers 410 may be different. As an example, the photoresist may be a chemical amplification resist.

The resist applying chamber 410 may be provided to the housing 810 of the substrate treating apparatus 800 according to an embodiment of the inventive concept.

Hereinafter, the substrate treating apparatus 800 will be described with reference to FIGS. 1 to 6.

The substrate treating apparatus 800 performs a teaching process, a liquid applying process, and an edge bead removal (EBR) process. The substrate treating apparatus 800 includes a housing 810, an air current providing unit 820, a substrate supporting unit 830, a liquid supplying unit 840, a treatment container 850, an elevation unit 890, a robot 932, a detector 938, and a controller 940.

The housing 810 has a rectangular tub shape having a space 812 in the interior thereof. An opening 815 is formed on one side of the housing 810. The opening 815 functions as a port through which the substrate W is carried in and out by the robot 932. A door 817 is installed in the opening 815, and the door 817 opens and closes the opening 815. If a substrate treating process is performed, the door interrupts the opening 815 and closes the interior space 812 of the housing 810. An inner outlet 814 and an outer outlet 816 are formed on the lower surface of the housing 810. The air in the housing 810 is exhausted to the outside through the inner outlet 814 and the outer outlet 816. According to an example, the air provided for the treatment container 850 may be exhausted through the inner outlet 814, and the air provided for the outside of the treatment container 850 may be exhausted through the outer outlet 816.

The air current providing unit 820 forms a descending air current in the interior space of the housing 810. The air current providing unit 820 includes an air current supply line 822, a fan 824, and a filter 826. The air current supply line 822 is connected to the housing 810. The air current supply line 822 supplies exterior air into the housing 810. The filter 826 filters air provided from the air current supply line 822. The filter 826 eliminates impurities contained in the air. The fan 824 is installed on the upper surface of the housing 810. The fan 824 is situated at a central area of the upper surface of the housing 810. The fan 824 forms a descending air current in the interior space of the housing 810. If the air is supplied from the air current supply line 822 to the fan 824, the fan 824 supplies the air downwards.

The substrate supporting unit 830 supports the substrate W in the interior space of the housing 810. The substrate supporting unit 830 rotates the substrate W. The substrate supporting unit 830 includes a support plate 832, a rotary shaft 834, and a driver 836. The support plate 832 has a circular disk shape. The substrate W makes contact with the upper surface of the support plate 832. The support plate 832 has a diameter that is smaller than that of the substrate W. According to an example, the support plate 832 may vacuum-suction the substrate W and chuck the substrate W. Optionally, the support plate 832 may be provided for an electrostatic chuck that chucks the substrate W by using static electricity. The support plate 832 may chuck the substrate W by a physical force. The rotary shaft 834 supports the support plate 832 under the support plate 832.

The rotary shaft 834 is provided such that the lengthwise direction thereof faces the upper and low sides. The rotary shaft 834 is provided to be rotatable about the central axis thereof. The driver 836 provides a driving force such that the rotary shaft 834 is rotated. For example, the driver 836 may be a motor.

The liquid supplying unit 840 supplies a treatment liquid onto the substrate W. The treatment liquid may be a photosensitive liquid or an edge bead removal liquid. The liquid supplying unit 840 includes an EBR nozzle 842 and a photosensitive liquid nozzle 844. The EBR nozzle 842 supplies an edge bead removal liquid onto the substrate W, and the photosensitive liquid nozzle 844 supplies a photosensitive liquid onto the substrate W. For example, the edge bead removal liquid may be a liquid that dilutes the photosensitive liquid. The edge bead removal liquid is a solvent, and the photoresist liquid may be a photosensitive liquid such as a resist. The EBR nozzle 842 supplies the edge bead removal liquid at a central location and a peripheral location of the substrate W, and the photosensitive liquid nozzle 844 supplies a photosensitive liquid at a central location of the substrate W. Here, the central locations refer to locations at which the nozzles 842 and 844 face the central area of the substrate W, and the peripheral location refers to a location at which the EBR nozzle 842 faces the peripheral area of the substrate W.

The treatment container 850 is situated in the interior space 812 of the housing 810. The treatment container 850 has a treatment space in the interior thereof. The treatment container 850 has an open-topped cup shape. The treatment container 850 includes an inner cup 852 and an outer cup 862.

The inner cup 852 has a circular disk shape that surrounds the rotary shaft 834. The inner cup 852 is situated to overlap the inner outlet 814 when viewed from the top.

The outer cup 862 has a cup shape that surrounds the substrate supporting unit 830 and the inner cup 852. The outer cup 862 has a bottom wall 864, a side wall 866, and an upper wall 870. The bottom wall 864 has a hollow circular disk shape. A recovery line 865 is formed in the bottom wall 864. The recovery line 865 recovers a treatment liquid supplied onto the substrate W. The treatment liquid recovered by the recovery line 865 may be reused by an external liquid recycling system. The side wall 866 has a circular tub shape that surrounds the substrate supporting unit 830. The side wall 866 extends from a side end of the bottom wall 864 in a direction perpendicular to the bottom wall 864. The side wall 866 extends upwards from the bottom wall 864.

The upper wall 870 extends from an upper end of the side wall 866 towards the inside of the outer cup 862. The upper wall 870 is provided to become closer to the substrate supporting unit 830. The upper wall 870 has a ring shape. An upper end of the upper wall 870 is higher than the substrate W supported by the substrate supporting unit 830.

The elevation unit 890 elevates the inner cup 852 and the outer cup 862. The elevation unit 890 includes an inner movable member 892 and an outer movable member 894. The inner movable member 892 elevates the inner cup 852, and the outer movable member 894 elevates the outer cup 862.

The robot 932 transports the substrate, and locates the substrate on the support plate 832 through the opening 815. The robot 932 may be the same as or similar to the aforementioned application robot 432.

The detector 938 detects a decentering value of a substrate positioned on the hand 934 of the robot 932, from the substrate. The detector 938 may be a sensor or a camera. According to an embodiment, the detector 938 may be provided to the hand 934. However, the detector 938 is not necessarily provided to the hand 934. The detector 938 may be installed at any place as long as it may detect a decentering value of the substrate positioned on the hand 934. The decentering value relates to the center of the substrate positioned on the support plate 832. Three or more point are mathematically necessary to detect the decentering value. Accordingly, at least three detectors 938 may be provided. According to an embodiment, at least four detectors 938 may be provided. If a notch formed in the substrate is situated at a part corresponding to the detector 938, it is impossible to detect a decentering value. Accordingly, at least fourth detectors 938 may be provided against the case.

The controller 940 controls rotation of the support plate 832 and the robot 932. The decentering value is detected by locating the substrate on the support plate 832 by the robot 932, rotating the support plate 832 by a set angle, and unloading the substrate from the support plate 832. The controller 940 has a calculation unit 950. The calculation unit 950 sets a location of the robot 932 by using the decentering values.

Next, a process of treating a substrate W by using the substrate treating apparatus 800 will be described. The teaching operation of setting a location of the robot 932 is performed, and then a substrate treating process of applying a liquid to the substrate is performed.

Figure 11:
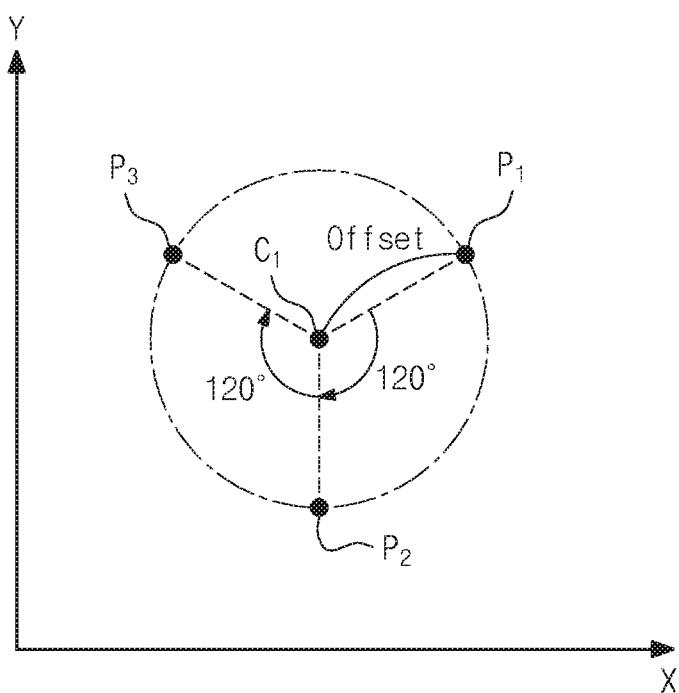
FIG. 11 is a view illustrating a method of setting a location of a robot by using three decentering values.
Figure 12:
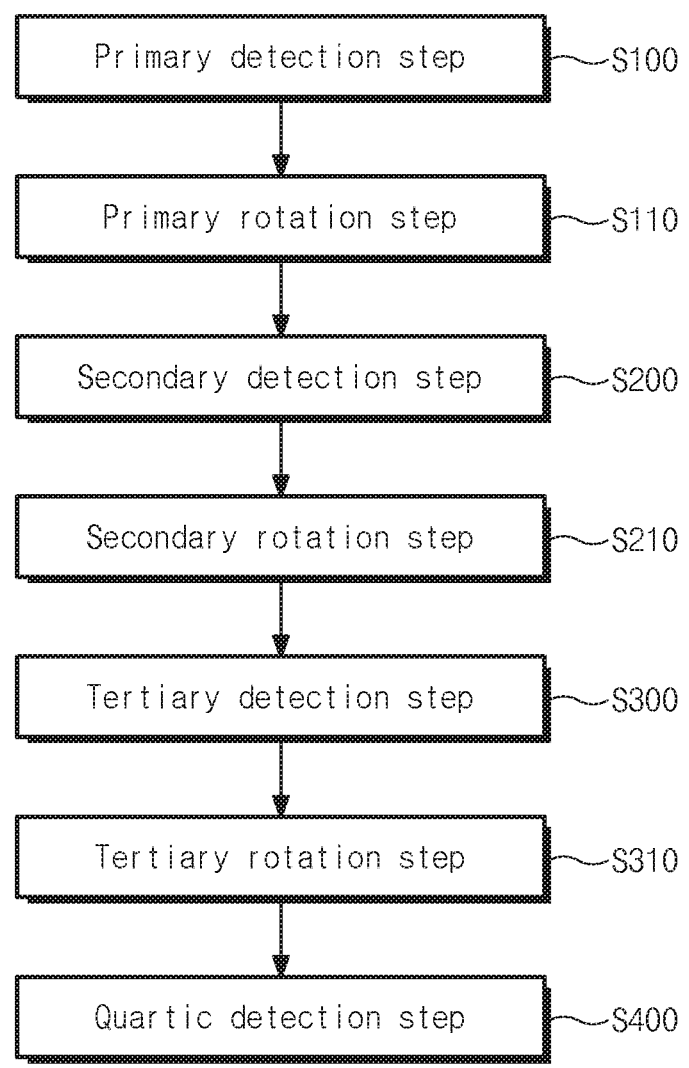
FIG. 12 is a flowchart illustrating steps of a teaching method for obtaining four decentering values.
Figure 13:
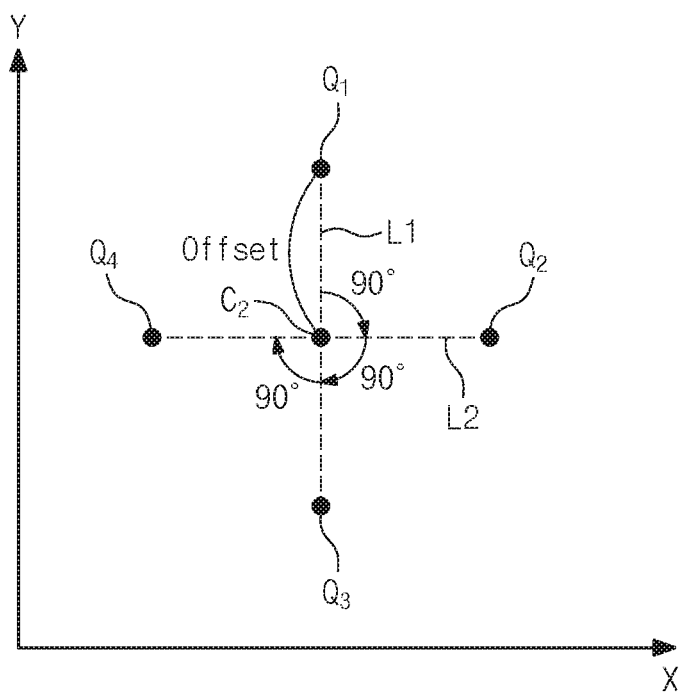
FIG. 13 is a view illustrating a method of setting a location of a robot by using four decentering values.

Hereinafter, a teaching method of setting a location of the robot 932 that feeds or transports the substrate will be described with reference to FIGS. 7 to 13. The arrows in the substrate of FIGS. 7 to 10 indicate directions of the substrate for illustrating that the substrate is rotated. FIG. 11 illustrates step of the teaching method. FIGS. 12 and 13 are views illustrating a method of setting a location of the robot according to the number of the detected decentering values.

The robot 932 loads the substrate on the support plate 832, and locates the substrate on the support plate 832 through the opening 815. The substrate may be a teaching zig. Meanwhile, an initial decentering value of the substrate on the hand 934 may be detected and acquired, before the substrate is loaded. The initial decentering value may directly detect the transported substrate on the hand 934. Alternatively, the transported substrate may be detected on the hand 934 after being loaded on the support plate 832 and then unloaded from the support plate 832. The decentering value may be detected by the detector 938 such as a sensor or a camera.

FIGS. 7 to 10 illustrates a teaching process in stages. The teaching process will be described with reference to FIGS. 7 to 10. A process of loading a substrate on the support plate 832 with the robot 932, rotating the support plate 832 by a set angle, unloading the substrate from the support plate 832 with the robot 932, and measuring a decentering value of the substrate positioned on the hand 934 of the robot 932 may be repeated a plurality of times, by using the controller 940. For example, the substrate of FIGS. 7 and 8 faces the second direction 14. Thereafter, the substrate is rotated. Accordingly, the substrate of FIGS. 9 and 10 faces the first direction 12.

A plurality of decentering values may be acquired by repeating the process a plurality of times. Then, the set angles always may be the same. The total sum of the plurality of set angles may be 360 degrees. The rotational direction is one direction.

According to an embodiment, at least three decentering values may be detected. The calculation unit 950 may set a location of the robot 932 by using the decentering values. As an example, at least three decentering values may be detected. When an initial decentering value of the substrate is detected before the substrate is loaded on the support plate 832, the process is performed twice. For example, two rotations may be performed while making the set angle 120 degrees.

A method of setting a location of the robot 932 by using three decentering values when the three decentering values are detected will be described with reference to FIG. 11.

In general, a circle that passes through all three points may be obtained in a mathematical method. Accordingly, a circle that passes through all the three decentering values may be obtained in a mathematical calculation method through the calculation unit 950. Among the three decentering values, the initial decentering value is denoted by P1, the following decentering value is denoted by P2, and the final decentering value is denoted by P3. The central point of the circle that passes through all of P1, P2, and P3 is denoted by C1. The location of the robot 932 may be set such that C1 correspond to the center of the support plate 832. First, an offset between P1 and C1 is calculated. Further, an initially set teaching value of the robot 932 is corrected by reflecting the offset. In this way, a new location of the robot 932 may be set. Thereafter, a substrate may be precisely fed and transported to the support plate 832 by using the corrected set teaching value.

As an example, four decentering values may be detected. The calculation unit 950 may set a location of the robot 932 by using the decentering values. When the initial decentering value is detected, the plurality of times is three times.

Among the acquired fourth decentering values, two sets of two decentering values are connected to each other, and the connection lines cross each other to form a cross point. The location of the robot 932 is set such that the cross point corresponds to the center of the support plate 832.

For example, the support plate 932 is rotated by 90 degrees so that the four decentering values may be detected. A method of setting a location of the robot 932 will be described with reference to FIGS. 12 to 13.

The method may include a primary detection step S100 of detecting a primary decentering value of the substrate while the substrate is situated on a hand 934 of the robot 932, a primary rotation step S110 of locating the substrate on the support plate 832 and rotating the support plate 832 by 90 degrees, a secondary detection step S200 of detecting a secondary decentering value of the substrate while the substrate is unloaded from the support plate 832 and situated on the hand 934 of the robot 932, a secondary rotation step S210 of locating the substrate on the support plate 832 and rotating the support plate 832 by 90 degrees, a tertiary detection step S300 of detecting a tertiary decentering value of the substrate while the substrate is unloaded from the support plate 832 and situated on the hand 934 of the robot 932, a tertiary rotation step S310 of locating the substrate on the support plate 832 and rotating the support plate 832 by 90 degrees, and a quartic detection step S400 of detecting a quartic decentering value of the substrate while the substrate is unloaded from the support plate 832 and situated on the hand 934 of the robot 932.

The primary decentering value has the same meaning as that of the aforementioned initial decentering value. The primary decentering value is denoted by Q1, the second decentering value is denoted by Q2, the tertiary decentering value is denoted by Q3, and the quartic decentering value is denoted by Q4. Further, a first line that connects the primary decentering value and the tertiary decentering value is denoted by L1, and a second line that connects the secondary decentering value and the quartic decentering value is denoted by L2. A cross point of L1 and L2 is denoted by C2.

A cross point C2 is formed when the first line L1 that connects the primary decentering value Q1 and the tertiary decentering value Q3 and the second line L2 that connects the secondary decentering value Q2 and the quartic decentering value Q4 cross each other. The location of the robot 932 may be set such that C2 correspond to the center of the support plate 832. First, an offset between Q1 and C2 is calculated. Further, an initial teaching setting value of the robot 932 is corrected by reflecting the offset. In this way, a new location of the robot 932 may be set. Thereafter, a substrate may be precisely fed and transported to the support plate 832 by using the corrected set teaching value.

The aforementioned teaching method of the robot 932 is not limited to the application robot 432, and may be applied to all substrate feeding robots that feed a substrate to a process treating chamber and also may be applied to substrate treating facilities that performs other processes such as a cleaning process.

Further, although it has been exemplified in the above description that the inventive concept is applied to a substrate treating facility having a structure in which a plurality of chambers are stacked, it may be applied to a substrate treating facility having one chamber.

As described above, after the teaching operation is completed, the substrate is transported onto the support plate 832 by using the robot 932. If the substrate is situated on the support plate 832, a process of treating the substrate is performed. In the substrate treating process, a liquid applying step and an edge bead removing step are sequentially performed.

The liquid applying step is a step of applying a photosensitive liquid to the entire area of the upper surface of the substrate W. The photosensitive liquid is supplied to a central area of the substrate W by the photosensitive liquid nozzle 844 and is applied to the entire area of the upper surface of the substrate W. If the photosensitive liquid is completely supplied, the edge bead removing step is performed. The edge bead removing step is a step of removing an edge bead or a photosensitive liquid applied to a peripheral area of the upper surface of the substrate W. In the edge bead removing step, an edge bead removal liquid is supplied to a peripheral area of the substrate W by the EBR nozzle 842. The photosensitive liquid applied onto the substrate W is removed by the edge bead removal liquid.

Referring back to FIGS. 1 to 4, the bake chamber 420 heat-treats the substrate W. For example, the bake chambers 420 perform a prebake process of eliminating organic substances and moisture on the surface of the substrate W by heating the substrate W at a predetermined temperature before a photoresist is applied or a soft bake process performed after a photoresist is applied onto the substrate W, and performs a cooling process of cooling the substrate W after the heating processes. The bake chamber 420 has a cooling plate 421 and a heating plate 422. The cooling plate 421 is provided with a cooling unit 423 such as cooling water or a thermoelectric element. The heating plate 422 is provided with a heating unit 424 such as a heating wire or a thermoelectric element. The cooling plate 421 and the heating plate 422 may be provided in one bake chamber 420. Optionally, some of the bake chambers 420 may include only a cooling plate 421, and some of the bake chambers 420 may include only a heating plate 422.

The development module 402 includes a process of eliminating a photoresist by supplying a development liquid to obtain a pattern on the substrate W, and a heat treating process, such as heating and cooling, which are performed on the substrate W before and after the development process. The development module 402 has a development chamber 460, a bake chamber 470, and a carrying chamber 480. The development chamber 460, the bake chamber 470, and the carrying chamber 480 are sequentially disposed along the second direction 14. Accordingly, the development chamber 460 and the bake chamber 470 are spaced apart from each other in the second direction 14 while the carrying chamber 480 is interposed therebetween. A plurality of development chambers 460 may be provided, and a plurality of development chambers 460 may be provided in each of the first direction 12 and the third direction 16. In the drawings, six development chambers 460 are illustrated as an example. A plurality of bake chamber 470 may be provided in each of the first direction 12 and the third direction 16. In the drawings, six bake chambers 470 are illustrated as an example. However, unlike this, a larger number of bake chambers 470 may be provided.

The carrying chamber 480 is situated in parallel to the second buffer 330 of the first buffer module 300 in the first direction 12. A development robot 482 and a guide rail 483 may be situated in the carrying chamber 480. The carrying chamber 480 has a substantially rectangular shape. The development robot 482 feeds the substrate W between the bake chambers 470, the development chambers 460, the second buffer 330 and the cooling chamber 350 of the first buffer module 300, and the second cooling chamber 540 of the second buffer module 500. The guide rail 483 is disposed such that the lengthwise direction thereof is parallel to the first direction 12. The guide rail 483 guides the development robot 482 such that the development robot 432 is linearly moved in the first direction 12. The development robot 482 has a hand 484, an arm 485, a support 486, and a prop 487. The hand 484 is fixedly installed in the arm 485. The arm 485 has a flexible structure such that the hand 484 is movable horizontally. The support 486 is provided such that the lengthwise direction thereof is disposed along the third direction 16. The arm 485 is coupled to the support 486 to be linearly movable in the third direction 16 along the support 486. The support 486 is fixedly coupled to the prop 487. The prop 487 is coupled to the guide rail 483 to be linearly movable along the guide rail 483.

The development chambers 460 have the same structure. However, the types of development liquids used in the development chambers 460 may be different. The development chambers 460 eliminate an area of the photoresist on the substrate W, to which light is irradiated. Then, an area of the protection film, to which light is irradiated, is eliminated together. Optionally, only an area of the photoresist and the protection film, to which light is not irradiated, may be eliminated according to the type of the used photoresist.

The development chamber 460 has a container 461, a support plate 462, and a nozzle 463. The container 461 has an open-topped cup shape. The support plate 462 is situated in the container 461, and supports the substrate W. The support plate 462 may be provided to be rotatable. The nozzle 463 supplies a development liquid onto the substrate W positioned on the support plate 462. The nozzle 463 may have a circular pipe shape, and may supply a development liquid to the center of the substrate W. Optionally, the nozzle 463 may have a length corresponding to the diameter of the substrate W, and the discharge hole of the nozzle 463 may be a slit. The development chamber 460 may be further provided with a nozzle 464 that supplies a cleaning liquid such as deionized water to clean the surface of the substrate W, to which the development liquid is additionally supplied.

The bake chamber 470 heat-treats the substrate W. For example, the bake chambers 470 may perform a post bake process of heating the substrate W before the development process, a hard bake process of heating the substrate W after the development process, and a cooling process of cooling the heated substrate after the bake process. The bake chamber 470 has a cooling plate 471 and a heating plate 472. The cooling plate 471 is provided with a cooling unit 473 such as cooling water or a thermoelectric element. The heating plate 472 is provided with a heating unit 474 such as a heating wire or a thermoelectric element. The cooling plate 471 and the heating plate 472 may be provided in one bake chamber 470. Optionally, some of the bake chambers 470 may include only a cooling plate 471, and some of the bake chambers 470 may include only a heating plate 472.

As described above, the application/development module 400 is provided such that the application module 401 and the development module 402 are separated. When viewed from the top, the application module 401 and the development module 402 may have the same chamber disposition.

The second buffer module 500 is provided as a passage through which the substrate W is transported, between the application/development module 400 and the pre/post-exposure module 600. The second buffer module 500 performs a process such as a cooling process or an edge exposing process on the substrate W. The second buffer module 500 has a frame 510, a buffer 520, a first cooling chamber 530, a second cooling chamber 540, an edge exposing chamber 550, and a second buffer robot 560. The frame 510 has a rectangular parallelepiped shape. The buffer 520, the first cooling chamber 530, the second cooling chamber 540, the edge exposing chamber 550, and the second buffer robot 560 are situated in the frame 510. The buffer 520, the first cooling chamber 530, and the edge exposing chamber 550 are disposed at a height corresponding to the application module 401. The second cooling chamber 540 is disposed at a height corresponding to the development module 402. The buffer 520, the first cooling chamber 530, and the second cooling chamber 540 are disposed in a row along the third direction 16. When viewed from the top, the buffer 520 is disposed along the carrying chamber 430 of the application module 401 in the first direction 12. The edge exposing chamber 550 is spaced apart from the buffer 520 or the first cooling chamber 530 by a predetermined distance in the second direction 14.

The second buffer robot 560 transports the substrate W between the buffer 520, the first cooling chamber 530, and the edge exposing chamber 550. The second buffer robot 560 is situated between the edge exposing chamber 550 and the buffer 520. The second buffer robot 560 may have a structure that is similar to that of the first buffer robot 360. The first cooling chamber 530 and the edge exposing chamber 550 perform a succeeding process on the substrates W, on which the application module 401 has performed a process. The first cooling chamber 530 cools the substrate W, on which the application module 401 has performed a process. The first cooling chamber 530 has a structure similar to that of the cooling chamber 350 of the first buffer module 300. The edge exposing chamber 550 exposes peripheries of the substrates W, on which the first cooling chamber 530 has performed a cooling process. The buffer 520 temporarily preserves the substrates W before the substrates W, on which the edge exposing chamber 550 has performed a process, are transported to a pre-treatment module 601, which will be described below. The second cooling chamber 540 cools the substrates W before the substrates W, on which a post-treatment module 602, which will be described below, has performed a process, are transported to the development module 402. The second buffer module 500 may further have a buffer at a height corresponding to the development module 402. In this case, the substrates W, on which the post-treatment module 602 has performed a process, may be transported to the development module 402 after being temporarily preserved in the added buffer.

When the exposure apparatus 900 performs an immersion/exposure process, the pre/post-exposure module 600 may perform a process of applying a protective film that protects the photoresist film applied to the substrate W during the immersion/exposure process. The pre/post-exposure module 600 may perform a process of cleaning the substrate W after the exposure process. Furthermore, when the application process is performed by using a chemical amplification resist, the pre/post-exposure module 600 may perform a bake process after the exposure process.

The pre/post-exposure module 600 has a pre-treatment module 601 and a post-treatment module 602. The pre-treatment module 601 performs a process of treating the substrate W before the exposure process, and the post-treatment module 602 performs a process of treating the substrate W after the exposure process. The pre-treatment module 601 and the post-treatment module 602 may be disposed to be partitioned from each other in different layers. According to an example, the pre-treatment module 601 is situated on the post-treatment module 602. The pre-treatment module 601 has the same height as that of the application module 401. The post-treatment module 602 has the same height as that of the development module 402. The pre-treatment module 601 has a protective film applying chamber 610, a bake chamber 620, and a carrying chamber 630. The protective film applying chamber 610, the carrying chamber 630, and the bake chamber 620 are sequentially disposed along the second direction 14. Accordingly, the protective film applying chamber 610 and the bake chamber 620 are spaced apart from each other in the second direction 14 while the carrying chamber 630 is interposed therebetween. A plurality of protective film applying chambers 610 are provided, and the plurality of protective film applying chambers 610 are disposed along the third direction 16 to form different layers. Optionally, a plurality of protective film applying chambers 610 may be provided in each of the first direction 12 and the third direction 16. A plurality of bake chambers 620 are provided, and the plurality of bake chambers 610 are disposed along the third direction 16 to form different layers. Optionally, a plurality of bake chambers 620 may be provided in each of the first direction 12 and the third direction 16.

The carrying chamber 630 is situated in parallel to the first cooling chamber 530 of the second buffer module 500 in the first direction 12. A pre-treatment robot 632 is situated in the carrying chamber 630. The carrying chamber 630 has a substantially square or rectangular shape. The pre-treatment robot 632 feeds the substrate W between the protective film applying chambers 610, the bake chambers 620, the buffer 520 of the second buffer module 500, and a first buffer 720 of the interface module 700, which will be described below. The pre-treatment robot 632 has a hand 633, an arm 634, and a support 635. The hand 633 is fixedly installed in the arm 634. The arm 634 has a flexible and rotatable structure. The arm 634 is coupled to the support 635 to be linearly movable in the third direction 16 along the support 635.

The protective film applying chamber 610 applies a protective film that protects a resist film during the immersion/exposure process, onto the substrate W. The protective film applying chamber 610 has a housing 611, a support plate 612, and a nozzle 613. The housing 611 has an open-topped cup shape. The support plate 612 is situated in the housing 611, and supports the substrate W. The support plate 612 may be provided to be rotatable. The nozzle 613 supplies a protection liquid for forming a protective film onto the substrate W positioned on the support plate 612. The nozzle 613 has a circular pipe shape, and may supply a protection liquid to the center of the substrate W. Optionally, the nozzle 613 may have a length corresponding to the diameter of the substrate W, and the discharge hole of the nozzle 613 may be a slit. In this case, the support plate 612 may be provided in a fixed state. The protection liquid includes an expandable material. The protection liquid may be a material that has a low affinity for a photoresist and water. For example, the protection liquid may include a fluorine-based solvent. The protective film applying chamber 610 supplies a protection liquid to a central area of the substrate W while rotating the substrate W positioned on the support plate 612.

The bake chamber 620 heat-treats the substrate W, to which the protective film is applied. The bake chamber 620 has a cooling plate 621 and a heating plate 622. The cooling plate 621 is provided with a cooling unit 623 such as cooling water or a thermoelectric element. The heating plate 622 is provided with a heating unit 624 such as a heating wire or a thermoelectric element. The heating plate 622 and the cooling plate 621 may be provided in one bake chamber 620. Optionally, some of the bake chambers 620 may include only a heating plate 622, and some of the bake chambers 620 may include only a cooling plate 621.

The post-treatment module 602 has a cleaning chamber 660, a post-exposure bake chamber 670, and a carrying chamber 680. The cleaning chamber 660, the carrying chamber 680, and the post-exposure chamber 670 are sequentially disposed along the second direction 14. Accordingly, the cleaning chamber 660 and the post-exposure bake chamber 670 are spaced apart from each other in the second direction 14 while the carrying chamber 680 is interposed therebetween. A plurality of cleaning chambers 660 are provided, and the plurality of cleaning chambers 610 are disposed along the third direction 16 to form different layers. Optionally, a plurality of cleaning chambers 660 may be provided in each of the first direction 12 and the third direction 16. A plurality of post-exposure bake chambers 670 are provided, and the plurality of post-exposure bake chambers 610 are disposed along the third direction 16 to form different layers. Optionally, a plurality of post-exposure bake chambers 670 may be provided in each of the first direction 12 and the third direction 16.

When viewed from the top, the carrying chamber 680 is situated in parallel to the second cooling chamber 540 of the second buffer module 500 in the first direction 12. The carrying chamber 680 has a substantially square or rectangular shape. A post-treatment robot 682 is situated in the carrying chamber 680. The post-treatment robot 682 transports the substrate W between the cleaning chambers 660, the post-exposure bake chambers 670, the second cooling chamber 540 of the second buffer module 500, and a second buffer 730 of the interface module 700, which will be described below. The post-treatment robot 682 provided in the post-treatment module 602 may have the same structure as that of the pre-treatment robot 632 provided in the pre-treatment module 601.

The cleaning chamber 660 cleans the substrate W after the exposure process. The cleaning chamber 660 has a housing 661, a support plate 662, and a nozzle 663. The housing 661 has an open-topped cup shape. The support plate 662 is situated in the housing 661, and supports the substrate W. The support plate 662 may be provided to be rotatable. The nozzle 663 supplies a cleaning liquid onto the substrate W positioned on the support plate 662. The cleaning liquid may be water such as deionized water. The cleaning chamber 660 supplies a cleaning liquid to a central area of the substrate W while rotating the substrate W positioned on the support plate 662. Optionally, the nozzle 663 may be linearly moved or rotated from a central area to a peripheral area of the substrate W while the substrate W is rotated.

After the exposure process, the bake chamber 670 heats the substrate W, on which the exposure process has been performed, by using a far infrared ray. After the exposure process, in the bake process, the substrate W is heated to finish a property change of the photoresist by amplifying acid produced in the photoresist through the exposure process. After the exposure process, the bake chamber 670 has a heating plate 672. The heating plate 672 is provided with a heating unit 674 such as a heating wire or a thermoelectric element. After the exposure process, the bake chamber 670 may be further provided with a cooling plate 671 in the interior thereof. The cooling plate 671 is provided with a cooling unit 673 such as cooling water or a thermoelectric element. Optionally, a bake chamber having only a cooling plate 671 may be further provided.

As described above, the pre/post-exposure module 600 is provided such that the pre-treatment module 601 and the post-treatment module 602 are completely separated from each other. The carrying chamber 630 of the pre-treatment module 601 and the carrying chamber 680 of the post-treatment module 602 may have the same size, and may completely overlap each other when viewed from the top. The protective film applying chamber 610 and the cleaning chamber 660 may have the same size, and may completely overlap with each other when viewed from the top. The bake chamber 620 and the post-exposure chamber 670 may have the same size, and may completely overlap with each other when viewed from the top.

The interface module 700 feeds the substrate W between the pre/post-exposure module 600 and the exposure apparatus 900. The interface module 700 has a frame 710, a first buffer 720, a second buffer 730, and an interface robot 740. The first buffer 720, the second buffer 730, and the interface robot 740 are situated within the frame 710. The first buffer 720 and the second buffer 730 are spaced apart from each other by a predetermined distance, and may be stacked. The first buffer 720 is disposed at a location higher than the second buffer 730. The first buffer 720 is situated at a height corresponding to the pre-treatment module 601, and the second buffer 730 is disposed at a height corresponding to the post-treatment module 602. When viewed from the top, the first buffer 720 is disposed along the first direction 12 while forming a row with the carrying chamber 630 of the pre-treatment module 601, and the second buffer 730 is disposed along the first direction 12 forming a row with the carrying chamber 630 of the post-treatment module 602.

The interface robot 740 is situated to be spaced apart from the first buffer 720 and the second buffer 730 in the second direction 14. The interface robot 740 transports the substrate W between the first buffer 720, the second buffer 730, and the exposure apparatus 900. The interface robot 740 has a structure that is substantially similar to that of the second buffer robot 560.

The first buffer 720 temporarily preserves the substrates W, on which the pre-treatment module 601 has performed a process, before they are moved to the exposure apparatus 900. The second buffer 730 temporarily preserves the substrates W, on which the exposure apparatus 900 has completely performed a process, before they are moved to the post-treatment module 602. The first buffer 720 has a housing 721 and a plurality of supports 722. The supports 722 are disposed within the housing 721, and are spaced apart from one another along the third direction 16. One substrate W is positioned on each of the supports 722. The housing 721 has openings (not illustrated) on a side on which the interface robot 740 is provided and on a side on which the pre-treatment robot 721 is provided so that the interface robot 740 and the pre-treatment robot 632 carry a substrate W into or out of the cooling plate 722. The second buffer 730 has a structure that is substantially similar to that of the first buffer 720. Meanwhile, the housing 4531 of the second buffer 730 has openings on a side on which the interface robot 740 is provided and on a side on which the post-treatment robot 682 is provided. The interface module may be provided only with buffers and a robot as described above while a chamber that performs a certain process on a substrate is not provided.

According to an embodiment, a substrate may be precisely located at a preset location of a support plate when the substrate is fed or transported.

According to an embodiment of the inventive concept, the precision of a treatment process may be improved.

The effects of the inventive concept are not limited to the above-mentioned effects, and the unmentioned effects can be clearly understood by those skilled in the art to which the inventive concept pertains from the specification and the accompanying drawings.

The above-mentioned detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A teaching method of setting a location of a robot that transports a substrate onto a rotatable support plate that supports the substrate, the teaching method comprising:
   loading a substrate on a support plate with a robot;
   rotating the support plate by a preset angle;
   unloading the substrate from the support plate with the robot;
   detecting a decentering value of the substrate positioned on a hand of the robot a plurality of times; and
   setting a location of the robot using the decentering values.

2. The teaching method of claim 1, further comprising:
   acquiring a decentering value of the substrate on the hand before the substrate is loaded on the support plate with the robot.

3. The teaching method of claim 1, wherein the decentering values are detected by using a sensor provided in the robot.

4. The teaching method of claim 1, wherein the decentering values are detected by using a camera.

5. The teaching method of claim 1, wherein the location of the robot is set by using three acquired decentering values.

6. The teaching method of claim 5, further comprising:
obtaining a central point of a circle that passes through all the three acquired decentering values,
wherein the location of the robot is set such that the central point corresponds to the center of the support plate.

7. The teaching method of claim 1, wherein the preset angle is 90 degrees and the plurality of times is four times.

8. The teaching method of claim 7, wherein two sets of two decentering values of the four acquired decentering values are connected to each other, respectively, via connected lines, the connected lines cross each other to form a cross point, and the location of the robot is set such that the cross point corresponds to the center of the support plate.

9. The teaching method of claim 1, further comprising:
detecting four decentering values; and
connecting two sets of two decentering values of the four acquired decentering values to each other, respectively, via connected lines,
wherein the connected lines cross each other to form a cross point, and wherein the location of the robot is set such that the cross point corresponds to the center of the support plate.

10. A teaching method of setting a location of a robot that transports a substrate onto a rotatable support plate that support the substrate, the teaching method comprising:
loading a substrate on a support plate with a robot;
unloading the substrate from the support plate with the robot; and
setting a location of the robot, wherein setting the location of the robot includes:
detecting a primary decentering value of the substrate while the substrate is situated on a hand of the robot;
locating the substrate on the support plate and rotating the support plate by 90 degrees;
detecting a secondary decentering value of the substrate while the substrate is unloaded from the support plate and situated on the hand of the robot;
locating the substrate on the support plate and rotating the support plate by 90 degrees;
detecting a tertiary decentering value of the substrate while the substrate is unloaded from the support plate and situated on the hand of the robot;
locating the substrate on the support plate and rotating the support plate by 90 degrees; and
detecting a quartic decentering value of the substrate while the substrate is unloaded from the support plate and situated on the hand of the robot.

11. The teaching method of claim 10, wherein a cross point of a first line that connects the primary decentering value and the tertiary decentering value and a second line that connects the secondary decentering value and the quartic decentering value is obtained, and the location of the robot is set such that the cross point corresponds to the center of the support plate.

12. The teaching method of claim 10, wherein the primary detection step is performed on the hand before the substrate is loaded on the support plate.

13. The teaching method of claim 10, wherein the primary detection step is performed on the hand after the substrate is loaded on the support plate and then unloaded from the support plate to the hand.

14. The teaching method of claim 10, wherein the centering values are detected by using a sensor provided in the robot.

15. The teaching method of claim 10, wherein the centering values are detected by using a camera.

16. An apparatus for treating a substrate, the apparatus comprising:
a rotatable support plate that supports the substrate;
a robot that has a hand on which the substrate is seated and transports the substrate on the support plate;
a detector that detects a decentering value of the substrate; and
a controller that has a calculation unit that sets a location of the robot by using detected decentering values, and that controls rotation of the support plate and the robot,
wherein the controller sets the location of the robot by using decentering values that are acquired by repeating an operation of loading the substrate on the support plate with the robot, rotating the support plate by a preset angle, unloading the substrate from the support plate with the robot, and detecting a decentering value of the substrate positioned on a hand of the robot a plurality of times.

17. The apparatus of claim 16, wherein the detector is a sensor provided in the robot.

18. The apparatus of claim 16, wherein the detector is a camera.

19. The apparatus of claim 16, wherein the controller controls the support and the robot such that the detector acquires three decentering values.

20. The apparatus of claim 19, wherein the calculation unit obtains the center of a circle that passes all the three detected decentering values, and the controller sets the location of the robot such that the center of the support plate corresponds to the center of the circle.

21. The apparatus of claim 16, wherein the controller controls rotation of the support plate and the robot such that the detector acquires four decentering values while taking the preset angle as 90 degrees.

22. The apparatus of claim 21, wherein the calculation unit connects two sets of two decentering values of the four acquired decentering values to each other, respectively, via connected lines to form a cross point, and sets the location of the robot such that the cross point corresponds to the center of the support plate.

23. The apparatus of claim 16, wherein the controller controls rotation of the support plate and the robot such that the detector acquires four decentering values, and the calculation unit connects two pairs of two decentering values of the acquired four decentering values, respectively, via connected lines to form a cross point, and sets the location of the robot such that the cross point corresponds to the center of the support plate.

24. The apparatus of claim 16, further comprising an edge bead removal (EBR) nozzle that supplies an edge bead removal liquid to a peripheral area of the substrate such that an edge bead formed at a periphery of the substrate is removed.

* * * * *